United States Patent [19]

Köhler et al.

[11] Patent Number: 5,141,976
[45] Date of Patent: Aug. 25, 1992

[54] MIXTURES OF POLYARYLENE SULPHIDES, NITROARYLMETHYLIDENE KETONES, GLASS FIBERS AND OPTIONALLY OTHER FILLERS

[75] Inventors: Burkhard Köhler; Wolfgang Rüsseler, both of Krefeld, Fed. Rep. of Germany; Joachim Döring, Tokyo, Japan; Hans-Detlef Heinz, Krefeld, Fed. Rep. of Germany

[73] Assignee: Bayer Aktiengesellschaft, Leverkusen, Fed. Rep. of Germany

[21] Appl. No.: 740,116

[22] Filed: Aug. 5, 1991

[30] Foreign Application Priority Data

Aug. 15, 1990 [DE] Fed. Rep. of Germany ....... 4025783

[51] Int. Cl.$^5$ ................................. C08K 5/32
[52] U.S. Cl. .................... 524/188; 524/109; 524/114; 524/260; 524/494
[58] Field of Search ............... 525/537; 524/260, 494, 524/114, 109, 188

[56] References Cited

U.S. PATENT DOCUMENTS

| | | | |
|---|---|---|---|
| 4,910,289 | 3/1990 | Harris | 525/537 |
| 4,952,624 | 8/1990 | Kohler et al. | 524/260 |
| 4,996,256 | 2/1991 | Heinz et al. | 524/260 |

FOREIGN PATENT DOCUMENTS

| | | |
|---|---|---|
| 286257 | 10/1988 | European Pat. Off. . |
| 0345551 | 4/1989 | European Pat. Off. . |
| 0345550 | 6/1989 | European Pat. Off. . |
| 0428020 | 9/1991 | European Pat. Off. . |

*Primary Examiner*—Veronica P. Hoke
*Attorney, Agent, or Firm*—Connolly & Hutz

[57] ABSTRACT

This invention relates to mixtures of polyarylene sulphides, nitroarylmethylidene ketones, glass fibers and optionally other fillers. The mixtures are distinguished by good mechanical properties.

5 Claims, No Drawings

MIXTURES OF POLYARYLENE SULPHIDES, NITROARYLMETHYLIDENE KETONES, GLASS FIBERS AND OPTIONALLY OTHER FILLERS

This invention relates to mixtures of polyarylene sulphides, epoxides, acid anhydrides, glass fibers and optionally other fillers (additives) The mixtures are distinguished by good mechanical properties.

Polyarylene sulphides (PAS) are known compounds (e.g. US-A 3 354 129, EP-A 171 021). They are inert, high temperature resistant thermoplasts which are capable of containing a high proportion of fillers such as glass fibers and/or other inorganic fillers The use of these polymers, in particular of polyphenylene sulphide (PPS), is increasing in fields which have hitherto been the preserve of duroplasts.

PAS has unsatisfactory mechanical properties for certain applications in the field of injection moulding. The edge fiber elongation and impact strength in particular are insufficient for practical purposes It has therefore been found advantageous to improve PAS in these properties, for example by mixing it with other thermoplasts.

The improvement in mechanical properties of PAS may also be obtained with mixtures of hydrogenated diene rubbers grafted with maleic acid anhydride and epoxides (JP-A 63-118369). The introduction of the large quantities of maleic acid anhydride-grafted polyolefins with a low glass temperature improves the toughness but does not significantly increase the flexural strength.

The profile of properties of such mixtures is still not quite satisfactory for certain applications.

It has now been found that mixtures of polyphenylene sulphide (PPS) with nitroarylmethylidene ketones, glass fibers and optionally other additives are distinguished by their mechanical properties.

The present invention therefore relates to mixtures of
(A) from 89.9 to 20% by weight of polyarylene sulphides, preferably polyphenylene sulphide,
(B) from 0.1 to 5% by weight of the reaction products of mono-, oligo- or polyketones containing at least two methylene groups vicinal to keto groups per molecule with nitroaryl aldehydes corresponding to formula (I)

$(O_2N)_n$—Ar—$(CHO)_m$      (I).

wherein
Ar stands for a $C_{6-14}$-divalent aromatic group,
n stands for 1 or 2 and
m stands for 1 or 2, and
(C) from 10 to 79.9% by weight, preferably from 30 to 60 % by weight, of glass fibers which are preferably sized with polyurethane film formers and aminosilane or epoxysilane bonding agents, most preferably aminosilane bonding agents, and optionally up to 300% by weight, based on the PAS, of other mineral or organic fillers and reinforcing materials and/or inorganic or organic auxiliary substances.

2-, 3-, and 4-nitrobenzaldehyde are preferred compounds of formula (I).

These compounds are preferably reacted with acetone, butanone, diethylketone, cyclopentanone, cyclohexanone or cyclodecanone to form the corresponding dinitrobenzal ketones which are then used as additives B) according to the invention.

The substances (B) are for the most part known and may be prepared by, for example, an aldol reaction in methanol catalyzed with NaOH, e.g. by a method analogous to that disclosed in Organikum, publishers VEB-Verlag, Berlin, 1973, 12th Edition, page 504.

According to the invention, the glass fibers used are commercially available glass fibers preferably sized with polyurethane film formers and amino silane or epoxy silane bonding agents. They have a diameter of from 1 to 20 μm, preferably from 5 to 13 μm. Endless glass fibers may be used and/or production processes may be employed in which the length of fibers in the finished mixture is from 0.05 to 10 mm, preferably from 0.1 to 2 mm. Endless fibers (rovings) may also be used in processes for the production of endless-reinforced unidirectional composites The glass fibers may also be replaced, in particular in part, by commercially available glass spheres, e.g. Ballotini glass spheres.

The following are examples of other mineral fillers and additives which may be used: Mica, talc, quartz powder, metal oxides and sulphides such as $TiO_2$, ZnO and ZnS, graphite, carbon black, fibers e.g. of quartz or carbon, carbonates such as $MgCO_3$ or $CaCO_3$ and sulphates such as $CaSO_4$ and $BaSO_4$.

Other conventional additives used include pigments, mould release agents, E-waxes, fluidizing agents, nucleating agents and stabilizers.

Fillers and additives may be used in quantities of from 0 to 300% by weight, based on the PAS.

The mixtures according to the invention may be prepared by the usual method of extrusion.

The mixtures according to the invention may be worked up by the usual methods to produce moulded parts, semi-finished goods, circuit boards, fibers, films, profiles, etc. The mixtures according to the invention are generally used advantageously wherever thermoplastically processible compositions are used.

EXAMPLES

The mixtures according to the invention were prepared at 320° C. in a double shaft extruder ZSK 32 of Werner and Pfleiderer.

The PPS used had a melt viscosity of 45 PAS (360° C.) and a shear stress of 1000 s$^{-1}$ and was prepared according to EP-A 171 021.

The glass fibers used were chopped glass strands Bayer CS 7916 ® sized with polyurethane film former and amino-silane bonding agent. These fibers were used in an amount of 40% by weight.

The mixtures were granulated and extruded to form test rods (e.g. measuring 80×10×4 mm). These were tested for flexural strength, edge fiber elongation, modulus in flexure and impact strength an (reversed notched ISO 180).

COMPARISON EXAMPLE

60% by weight of PPS were mixed with 40% by weight of glass fibers.

EXAMPLE 1

59% by weight of PPS were mixed with 40% by weight of glass fibers and 1% by weight of 2,6-bis-(4-nitro-benzal)-cyclohexanone.

The mechanical properties are summarized in the following table.

| Example | Flexural strength (MPa) | Edge fibre elongation (%) | Bending modulus (MPa) | Izod Impact strength (kJ/m²) |
|---|---|---|---|---|
| Comparison | 250 | 1.9 | 13,000 | 30 |
| 1 | 299 | 2.4 | 12,800 | 44 |

We claim:
1. Mixtures of
(A) from 89.9 to 20% by weight of polyarylene sulphides,
(B) from 0.1 to 5% by weight of a dinitrobenzal ketone which is the reaction product of a ketone which comprises acetone, butanone, diethyl ketone, cyclopentanone, cyclohexanone or cyclodecanone with a nitroaryl aldehyde, in a molar ratio of 2:1 of aldehyde to ketone, which nitroaryl alkehyde corresponds to formula (I)

$$(O_2M)_n-Ar-(CHO)_m \quad (I)$$

wherein
Ar stands for a $C_{6-14}$-dovalent aromatic group,
n stands for 1 or 2 and
m stands for 1 or 2, and
(C) from 10 to 79.9% by weight of glass fibers.

2. The mixture claimed in claim 1 wherein the glass fiber (C) is sized with polyurethane film formers and aminosilane or epoxysilane bonding agents.

3. The mixture claimed in claim 2 wherein the bonding agent is aminosilane.

4. The mixture claimed in claim 1 which further contains up to 300% by weight, based on polyarylene sulphides, of mineral or organic filler.

5. A shaped article which comprises the mixture claimed in claim 1.

* * * * *